(12) United States Patent
Yamanaka et al.

(10) Patent No.: US 9,772,072 B2
(45) Date of Patent: Sep. 26, 2017

(54) ILLUMINATION APPARATUS

(71) Applicant: Panasonic Intellectual Property Management Co., Ltd., Osaka (JP)

(72) Inventors: Kazuhiko Yamanaka, Toyama (JP); Kiyoshi Morimoto, Osaka (JP); Yoshihisa Nagasaki, Osaka (JP); Seigo Shiraishi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 17 days.

(21) Appl. No.: 14/990,614

(22) Filed: Jan. 7, 2016

(65) Prior Publication Data

US 2016/0116123 A1 Apr. 28, 2016

Related U.S. Application Data

(63) Continuation of application No. PCT/JP2014/001917, filed on Apr. 2, 2014.

(30) Foreign Application Priority Data

Jul. 25, 2013 (JP) ................................. 2013-154257

(51) Int. Cl.
*F21V 9/16* (2006.01)
*F21K 99/00* (2016.01)
(Continued)

(52) U.S. Cl.
CPC .................. *F21K 9/56* (2013.01); *F21K 9/64* (2016.08); *H01S 5/005* (2013.01); *H01S 5/32341* (2013.01); *H01S 5/4031* (2013.01)

(58) Field of Classification Search
CPC ........... H01S 5/005; H01S 5/4031; F21V 9/16
(Continued)

(56) References Cited

U.S. PATENT DOCUMENTS 9,170,424 B2 * 10/2015 Takahashi .......... G02B 27/1033
2009/0040598 A1 2/2009 Ito
(Continued)

FOREIGN PATENT DOCUMENTS

JP 2009-043668 2/2009
JP 2009-539219 11/2009
(Continued)

OTHER PUBLICATIONS

International Search Report of PCT application No. PCT/JP2014/001917 dated Jun. 24, 2014.

*Primary Examiner* — Anshik Kim
(74) *Attorney, Agent, or Firm* — McDermott Will & Emery LLP

(57) ABSTRACT

An illumination apparatus of the disclosure includes a semiconductor light-emitting element and a light conversion element. The semiconductor light-emitting element has a first optical waveguide and a second optical waveguide. The light conversion element has a first light converter and a second light converter. A first emitted light emitted from first optical waveguide enters the first light converter and a second emitted light emitted from the second optical waveguide enters the second light converter. First power applied to the first optical waveguide and second power applied to the second optical waveguide are independent.

11 Claims, 16 Drawing Sheets

(51) Int. Cl.
- *H01S 5/00* (2006.01)
- *H01S 5/323* (2006.01)
- *F21K 9/64* (2016.01)
- *H01S 5/40* (2006.01)

(58) Field of Classification Search
USPC .......................................................... 362/84
See application file for complete search history.

(56) References Cited

U.S. PATENT DOCUMENTS

| | | | |
|---|---|---|---|
| 2009/0187234 A1 | 7/2009 | Meyer et al. | |
| 2010/0080001 A1 | 4/2010 | Kunoh et al. | |
| 2010/0284433 A1* | 11/2010 | Hata | B82Y 20/00 372/45.011 |
| 2010/0290498 A1 | 11/2010 | Hata et al. | |
| 2011/0157865 A1 | 6/2011 | Takahashi et al. | |
| 2016/0264860 A1* | 9/2016 | Lub | C09K 11/06 |

FOREIGN PATENT DOCUMENTS

| | | |
|---|---|---|
| JP | 2010-109331 | 5/2010 |
| JP | 2010-256457 | 11/2010 |
| JP | 2011-154995 | 8/2011 |
| JP | 2012-204671 | 10/2012 |
| JP | 2013-120735 | 6/2013 |

* cited by examiner

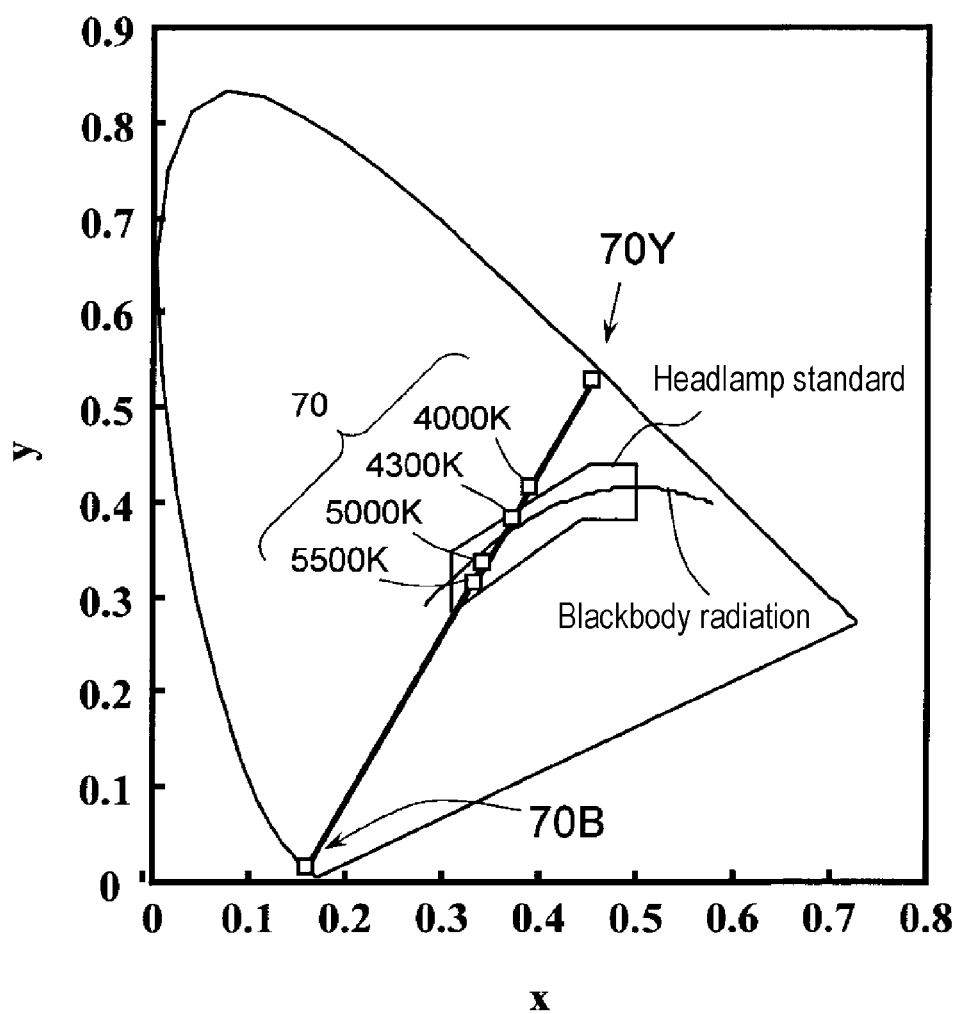

ILLUMINATION APPARATUS

BACKGROUND OF THE INVENTION

1. Field of the Invention

This disclosure relates to an illumination apparatus using light generated by irradiating a light converter with light emitted from a light source.

2. Description of the Related Art

In the related art, as illustrated in FIG. 15, such an illumination apparatus includes light-emitting element 1001, phosphor wheel 1002, and electronic driving unit 1003. Phosphor wheel 1002 emits second light by receiving first light emitted from light-emitting element 1001. Electronic driving unit 1003 controls light intensity of the first light emitted from light-emitting element 1001.

Light-emitting element 1001 is driven by a pulse driving current of electronic driving unit 1003. Light-emitting element 1001 emits a pulse light beam that is the first light according to the pulse driving current. A pulse length and a frequency of the first light are adjusted so that the second light emitted by phosphor wheel 1002 is white light.

For example, if a pulse length of the first light passing through a blue section of phosphor wheel 1002 is increased, an emission color of the second light is shifted to a blue side.

As a related art document information concerning this application, for example, Japanese Patent Unexamined Publication (Translation of PCT Application) No. 2009-539219 is known.

SUMMARY OF THE INVENTION

In such a configuration described above, it is necessary to synchronize the pulse driving current to rotation of phosphor wheel 1002. However, when a rotation mechanism of phosphor wheel 1002 is deteriorated by an operation for a long period of time, the synchronization between the rotation of phosphor wheel 1002 and the pulse driving current is unstable. Thus, adjustment of the color temperature of the emitted light from the illumination apparatus is unstable.

An object of the disclosure is to stabilize and can adjust a color temperature of an illumination apparatus.

An illumination apparatus of the disclosure to solve the problem described above includes a semiconductor light-emitting element and a light conversion element. The semiconductor light-emitting element has a first optical waveguide and a second optical waveguide. The light conversion element has a first light converter and a second light converter. A first emitted light emitted from the first optical waveguide enters the first light converter and a second emitted light emitted from the second optical waveguide enters the second light converter. First power applied to the first optical waveguide and second power applied to the second optical waveguide are independent.

According to the configuration, it is possible to independently change intensity of the light entering the first light converter and intensity of the entering the second light converter. In this case, since the rotation of the light conversion element is not necessary, it is possible to stably adjust the color temperature of the emitted light from the illumination apparatus.

BRIEF DESCRIPTION OF DRAWINGS

FIG. 4 is a chromaticity diagram of light emission characteristics of the illumination apparatus in Embodiment 1 of the disclosure.

DETAILED DESCRIPTION OF THE PREFERRED EMBODIMENTS

Hereinafter, embodiments of the disclosure will be described with reference to the drawings.

Embodiment 1

Figure 1:
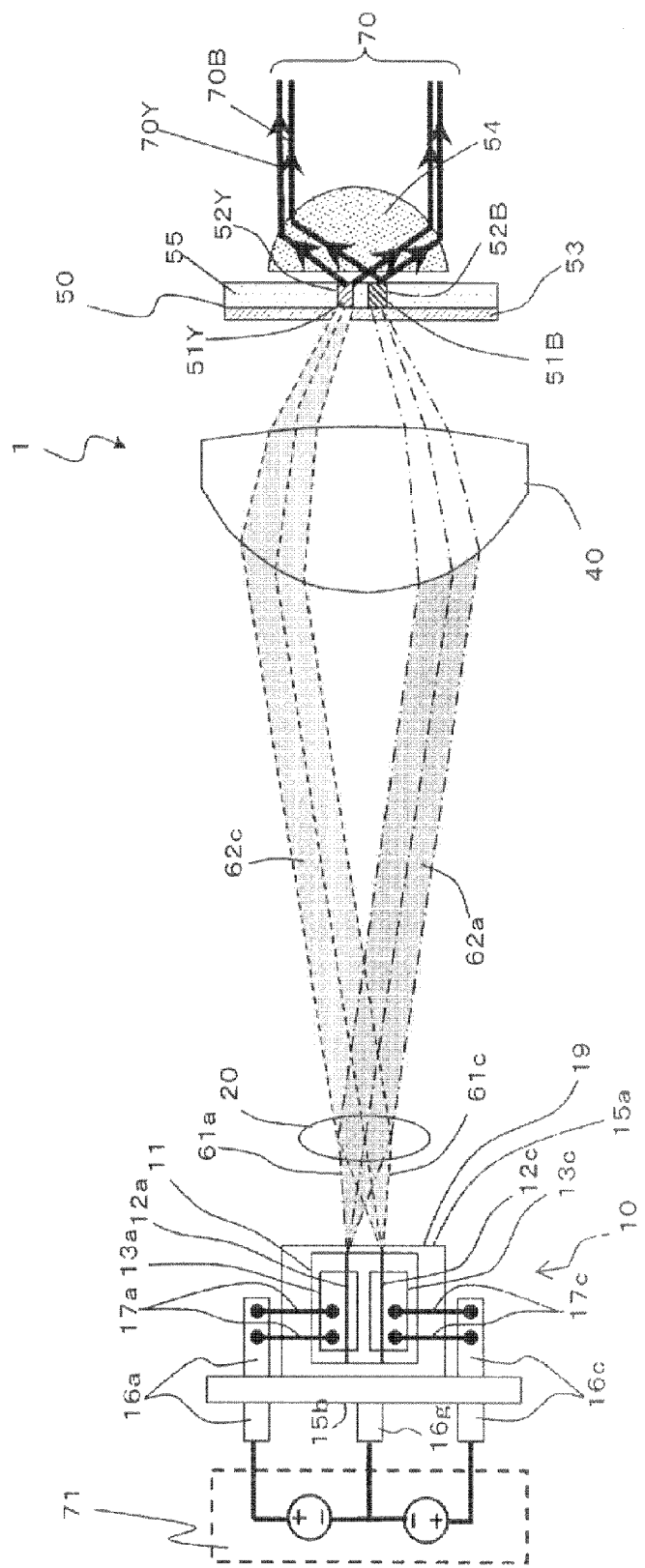
FIG. 1 is a schematic view illustrating a configuration of an illumination apparatus in Embodiment 1 of the disclosure.

FIG. 1 is a schematic view illustrating a structure of illumination apparatus 1 in Embodiment 1. Illumination apparatus 1 in Embodiment 1 includes semiconductor light-emitting element 11 and light conversion element 50. Semiconductor light-emitting element 11 has first optical waveguide 12a and second optical waveguide 12c. Light conversion element 50 has first light converter 51B and second light converter 51Y. First emitted light 61a emitted from first optical waveguide 12a enters first light converter 51B and second emitted light 61c emitted from second optical waveguide 12c enters second light converter 51Y. First power applied to first optical waveguide 12a and second power applied to second optical waveguide 12c are independent.

According to the configuration, it is possible to independently change intensity of the light entering first light converter 51B and intensity of the light entering second light converter 51Y. In this case, since rotation of light conversion element 50 is not necessary, it is possible to stably adjust a color temperature of the emitted light from the illumination apparatus.

Hereinafter, a further specific configuration including arbitrary configurations that are not essential will be described.

Configuration

Figure 2:
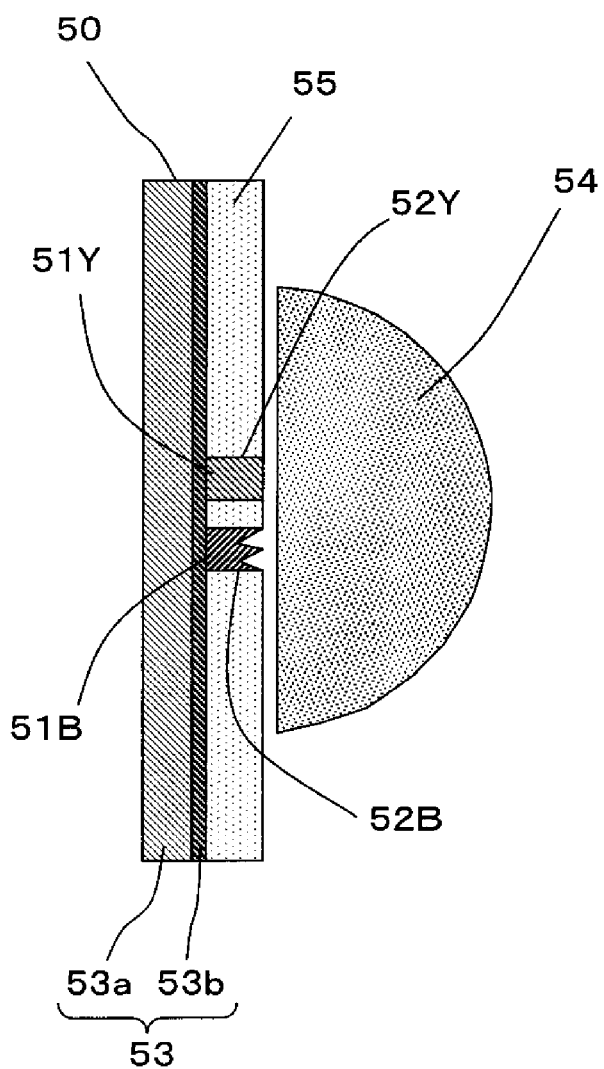
FIG. 2 is a schematic view illustrating a light conversion element and a second condensing lens of the illumination apparatus in Embodiment 1 of the disclosure.

First, the configuration of the illumination apparatus of the embodiment will be described with reference to FIGS. 1 and 2. FIG. 1 is a view illustrating a structure of light-emitting element 1 in Embodiment 1. Semiconductor light-emitting element 11 mounted on light emitting device 10 is, for example, a nitride semiconductor laser element formed of nitride of group III elements (Al, Ga, and In). Semiconductor light-emitting element 11 has a multi-stripe structure in which first optical waveguide 12a and second optical waveguide 12c having a ridge strip shape are provided in parallel. Collimator lens 20 and condensing lens 40 are arranged in order in an emitting direction of light emitting device 10. Collimator lens 20 makes first emitted light 61a from semiconductor light-emitting element 11 be first emitted light 62a that is parallel light and second emitted light 61c from semiconductor light-emitting element 11 be second emitted light 62c that is parallel light. Thereafter, condensing lens 40 condenses first emitted light 62a and second emitted light 62c. Light conversion element 50 is disposed at a focal point of condensing lens 40. Hereinafter, the above configuration elements will be described in detail.

Light Emitting Device

Light emitting device 10 has package 19 and semiconductor light-emitting element 11 mounted on package 19. Package 19 is configured of post 15a, base 15b, first lead pin 16a, second lead pin 16c, third lead pin 16g, and the like.

Semiconductor light-emitting element 11 has a structure in which a semiconductor layer is laminated on a substrate, and emits light of a wavelength of 420 nm to 500 nm. Specifically, semiconductor light-emitting element 11 has a structure in which, for example, the semiconductor layer of nitride of group III elements (Al, Ga, and In) is laminated on the substrate that is an n-type GaN substrate. Specifically, the semiconductor layer is configured by laminating an n-type clad layer, an n-type guide layer, an InGaN quantum well layer, a p-type optical guide layer, an electronic block layer, a p-type clad layer, and a p-type electrode contact layer in this order. In this case, as an n-type dopant of nitride semiconductor, for example, Si, Ge, and the like are preferred, and as a p-type dopant, Mg and the like are preferred.

First optical waveguide 12a and second optical waveguide 12c formed in semiconductor light-emitting element 11 are, for example, configured of the ridge strip of the semiconductor laser. The ridge strip is formed, for example, by patterning by semiconductor lithography and dry etching. Specifically, for example, $SiO_2$ film (not illustrated) is deposited on a wafer surface in which a semiconductor layer is laminated by chemical vapor deposition (CVD) and the like. Mask patterning of the ridge strip is performed on the $SiO_2$ film by using photolithography and a plurality of stripe structures of a ridge shape are formed by dry etching. Thus, a gap between first optical waveguide 12a and second optical waveguide 12c illustrated in the embodiment is accurately controlled by the photolithography. Sequentially, first electrode 13a and second electrode 13c are formed on the stripe structure. First electrode 13a and second electrode 13c are formed by, for example, depositing one or a plurality of metals such as Pd, Pt, Ni, Ti, and Au, and by patterning. First electrode 13a and first lead pin 16a are electrically connected by first meal thin wire 17a that is a gold wire. Second electrode 13c and second lead pin 16c are electrically connected by second metal thin wire 17c that is a gold wire. First electrode 13a and second electrode 13c are electrically separated.

Package 19 has base 15b and post 15a disposed on base 15b. Semiconductor light-emitting element 11 is mounted on post 15a. base 15b is made of, for example, iron or copper. Post 15a is made of, for example, iron or copper. An opening portion is formed in base 15b. First lead pin 16a and second lead pin 16c are fixed to the opening portion through an insulation member (not illustrated). Third lead pin 16g is fixed to base 15b. Third lead pin 16g is electrically connected to base 15b. One end of first lead pin 16a is electrically connected to first meal thin wire 17a. One end of second lead pin 16c is electrically connected to second metal thin wire 17c. The other end of first lead pin 16a and the other end of second lead pin 16c are electrically connected to external circuit 71 by wiring disposed on a side opposite to post 15a with respect to base 15b.

Light emitting device 10 may be hermetically sealed by a cap (not illustrated) on which a window glass is mounted to seal semiconductor light-emitting element 11.

Collimator Lens

Collimator lens 20 is preferably a spherical lens or an aspherical lens made of, for example, crown glass such as B270, borosilicate glass such as BK7, and the like. An antireflection film configured of a dielectric multilayer film is provided on a surface of collimator lens 20. The dielectric multilayer film is configured to match wavelengths of first emitted light 61a and second emitted light 61c of semiconductor light-emitting element 11. Collimator lens 20 may be fixed to package 19 of light emitting device 10 together with a housing (not illustrated).

Condensing Lens

Condensing lens 40 is a spherical lens or an aspherical lens made of a transparent material of, for example, crown glass such as B270, borosilicate glass such as BK7, and the like. Condensing lens 40 condenses first emitted light 62a and second emitted light 62c emitted from collimator lens 20 at a predetermined position of light conversion element 50.

Light Conversion Element

Next, a structure of light conversion element 50 will be described with reference to FIGS. 1 and 2. FIG. 2 is a schematic view illustrating light conversion element 50 and second condensing lens 54. Light conversion element 50 has base 55 configured of, for example, aluminum alloy material, first through-hole 52B, and second through-hole 52Y provided in base 55. First light converter 51B is formed in first through-hole 52B. First light converter 51B is made of a transparent material such as glass on a surface of which irregularities are formed. Second light converter 51Y is provided in second through-hole 52Y. Second light converter 51Y has a phosphor that converts a wavelength of second emitted light 61c from semiconductor light-emitting element 11 to a long wavelength. Specifically, second light converter 51Y has the phosphor that converts light of which a main wavelength range is 420 nm to 500 nm to light of which a main wavelength range is 550 nm to 700 nm. The phosphor configures second light converter 51Y by being mixed with binder configured of, for example, an organic material such as silicone and epoxy, an inorganic material such as low-melting point glass, aluminum oxide, and zinc oxide. As specific examples of the phosphor, Ce-activated garnet crystal phosphor ($(Y, Gd)_3(Ga, Al)_5O_{12}:Ce^{3+}$ phosphor), Eu-activated $(Ba, Sr)Si_2O_2N_2$ phosphor, and the like are included.

Dichroic mirror 53 is provided on a surface on a condensing lens 40 side of base 55 of light conversion element 50. Dichroic mirror 53 transmits light of, for example, a wavelength of 430 nm or less and reflects light of a wavelength of 430 nm or more. Dichroic mirror 53 has transparent substrate 53a such as glass, sapphire, and aluminum nitride, and filter 53b that is, for example, the dielectric multilayer film, and filter 53b is disposed on base 55 side.

Second condensing lens 54 is disposed in a position opposite to condensing lens 40 with respect to light conversion element 50. Second condensing lens 54 is a spherical lens or an aspherical lens made of the transparent material of, for example, crown glass such as B270, borosilicate glass such as BK7, and the like. It is preferable that second condensing lens 54 has a sufficiently large radius of curvature to efficiently capture the phosphor radiated from second light converter 51Y and a diffused light radiated from first light converter 51B. A numerical aperture of second condensing lens 54 is set to be a numerical aperture (NA) higher than the light emitted from first light converter 51B and second light converter 51Y, for example, a numerical aperture of 0.8 or more.

First light converter 51B and second light converter 51Y described above are disposed preferably within a circle of a diameter of 5 mm and more preferably within a circle of a diameter of 2 mm. A gap between first light converter 51B and second light converter 51Y is determined by the arrangement of first through-hole 52B and second through-hole 52Y formed in base 55.

A gap between first through-hole 52B and second through-hole 52Y can be accurately adjusted by press processing, for example, using a mold and the like.

Light Emitting Operation

Sequentially, an operation of illumination apparatus 1 in the embodiment will be described with reference to FIGS. 1 and 2. First optical waveguide 12a of semiconductor light-emitting element 11 emits first emitted light 61a that is laser light of which a wavelength is, for example, 420 nm to 500 nm and second optical waveguide 12c emits second emitted light 61c that is laser light of which a wavelength is, for example, 420 nm to 500 nm. First emitted light 61a is converted into first emitted light 62a that is substantially parallel light by collimator lens 20. Second emitted light 61c is converted into second emitted light 62c that is substantially parallel light by collimator lens 20. First emitted light 62a and second emitted light 62c are collected in condensing lens 40 and enter a predetermined position of light conversion element 50. Specifically, first optical waveguide 62a enters first light converter 51B in light conversion element 50 and second optical waveguide 62c enters second light converter 51Y in light conversion element 50. A distance between first optical waveguide 12a and second optical waveguide 12c is set to be, for example, 200 μm. A distance between first light converter 51B and second light converter 51Y is set to be, for example, 200 μm to 1 mm.

When a distance between an emitting portion of first optical waveguide 12a and an emitting portion of second optical waveguide 12c is h, a distance between first light converter 51B and second light converter 51Y is h', a lateral magnification of an optical system configured of collimator lens 20 and condensing lens 40 is β, h, h', and β are set to satisfy a relationship of h'=β×h. Thus, the lateral magnification of the optical system is set to be 1 time to 5 times and thereby it is possible to easily design the distance h and the distance h' described above. Thus, first emitted light 62a can easily enter first light converter 51B and second emitted light 62c can easily enter second light converter 51Y.

Furthermore, a region in which first emitted light 62a and second emitted light 62c enters condensing lens 40 is sufficiently small with respect to a pupil diameter of condensing lens 40. Thus, since an angle at which first emitted light 62a enters first light converter 51B can be small, it is possible to further freely set the design of the lateral magnification.

First emitted light 62a incident on first light converter 51B becomes first radiation light 70B of which coherence is lowered by an irregularity portion of first light converter 51B. Some of second emitted light 62c incident on second light converter 51Y is converted into, for example, second radiation light 70Y of which a main wavelength range is 550 nm to 700 nm by the phosphor included in second light converter 51Y. First radiation light 70B and second radiation light 70Y are emitted on second condensing lens 54 side. First radiation light 70B and second radiation light 70Y are radiation light of which a so-called radiation angle is Lambertian. If first radiation light 70B and second radiation light 70Y enter second condensing lens 54, first radiation light 70B and second radiation light 70Y are mixed in second condensing lens 54, become white light 70 having high direction, and are emitted to an outside of illumination apparatus 1. It is possible to efficiently emit white light 70 from illumination apparatus 1 to the outside by the configuration. Since first light converter 51B lowers coherence of first emitted light 62a, it is possible to reduce interference noise of first emitted light 62a and to use some of first emitted light 62a as the radiation light.

Dimming Operation

Sequentially, an emission spectrum and a color temperature of the illumination apparatus of the embodiment will be described with reference to FIGS. 3A, 3B, 3C, and 4. The emission spectrum and the color temperature of the illumination apparatus of the embodiment can be arbitrarily polarized.

Figure 3A:
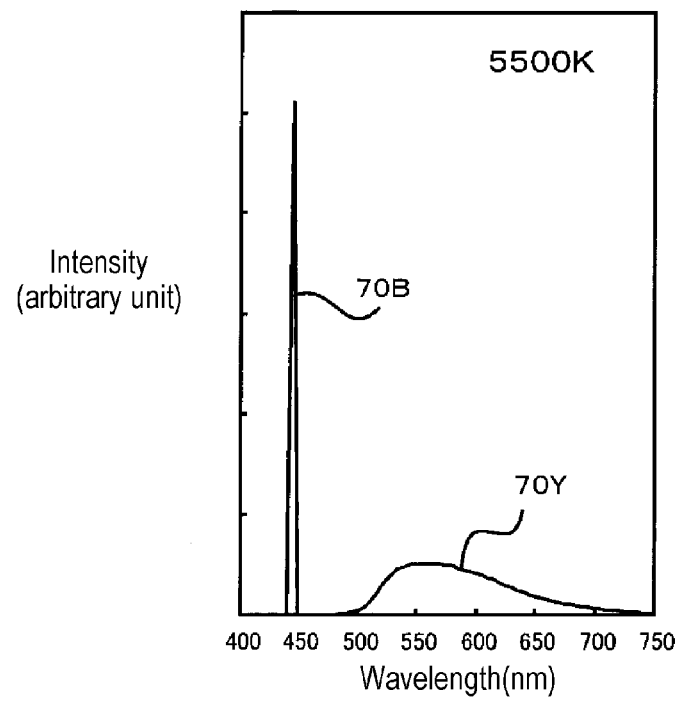
FIG. 3A is a graph illustrating an emission spectrum when a color temperature of white light of the illumination apparatus in Embodiment 1 of the disclosure is 5500 K.
Figure 3B:
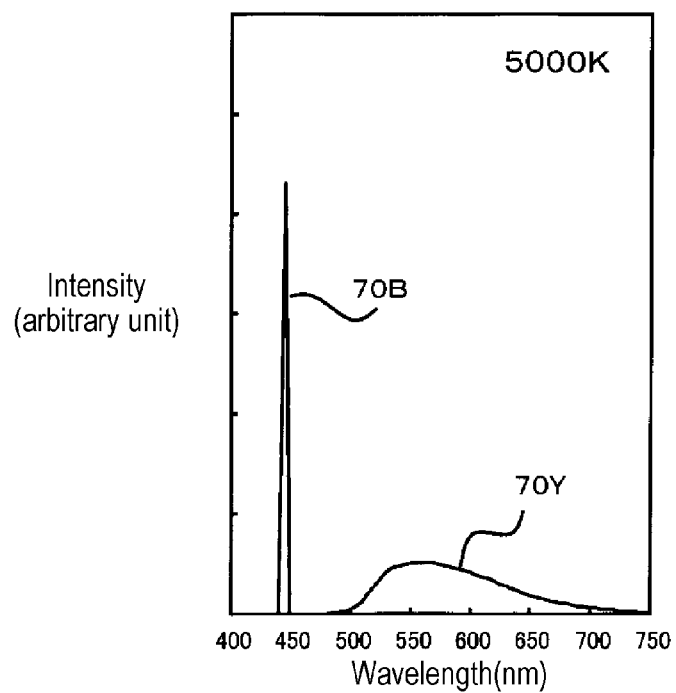
FIG. 3B is a graph illustrating an emission spectrum when the color temperature of the white light of the illumination apparatus in Embodiment 1 of the disclosure is 5000 K.
Figure 3C:
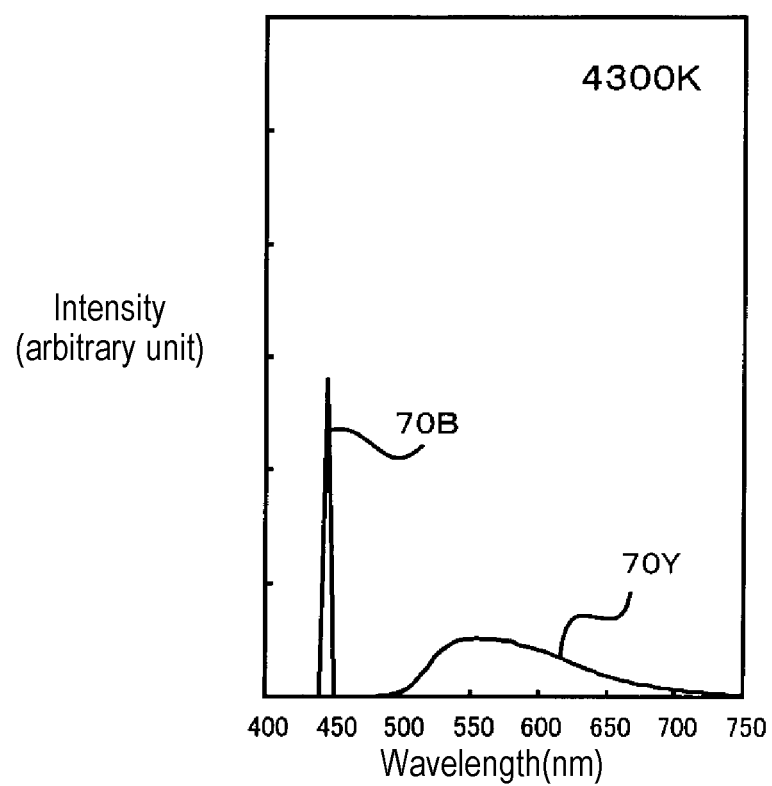
FIG. 3C is a graph illustrating an emission spectrum when the color temperature of the white light of the illumination apparatus in Embodiment 1 of the disclosure is 4300 K.

FIG. 3A represents the emission spectrum when the color temperature of white light 70 is 5500K. FIG. 3B represents the emission spectrum when the color temperature of white light 70 is 5000K. FIG. 3C represents the emission spectrum when the color temperature of white light 70 is 4300K. As illustrated in FIGS. 3A, 3B, and 3C, the color temperature of white light 70 can be easily changed by changing a ratio of an output of first radiation light 70B of which a main component is blue light and an output of second radiation light 70Y of which a main component is yellow light. In the embodiment, it is possible to change a ratio of first radiation light 70B and second radiation light 70Y by changing a ratio of power applied to first optical waveguide 12a and power applied to second optical waveguide 12c of semiconductor light-emitting element 11. Thus, it is possible to easily change the color temperature of white light 70 emitted from illumination apparatus 1.

Effect of the embodiment will be described with reference to chromaticity coordinates illustrated in FIG. 4. Chromaticity points when the color temperature of white light 70 is 5500K, 5000K, 4300K, and 4000K are plotted on the chromaticity coordinates. Chromaticity ranges of the white light used for a vehicle headlamp that are determined by Japanese Industrial Standards are also plotted. As illustrated in FIG. 4, for example, if the range of the color temperature is 5500K to 4300K, it is possible to use the illumination apparatus of which the color temperature can be changed in the headlamp of the vehicle.

In the configuration described above, second radiation light 70Y radiated from second light converter 51Y may be light that is obtained by mixing light that is emitted by converting second emitted light 62c by the phosphor of second light converter 51Y and light radiated by allowing second emitted light 62c to multiple-reflect on an inside of second light converter 51Y. In this case, second radiation light 70Y is light that is obtained by mixing light of which a main wavelength range is 550 nm to 700 nm and light of which a main wavelength range is 420 nm to 500 nm.

MODIFICATION EXAMPLES

Figure 5:
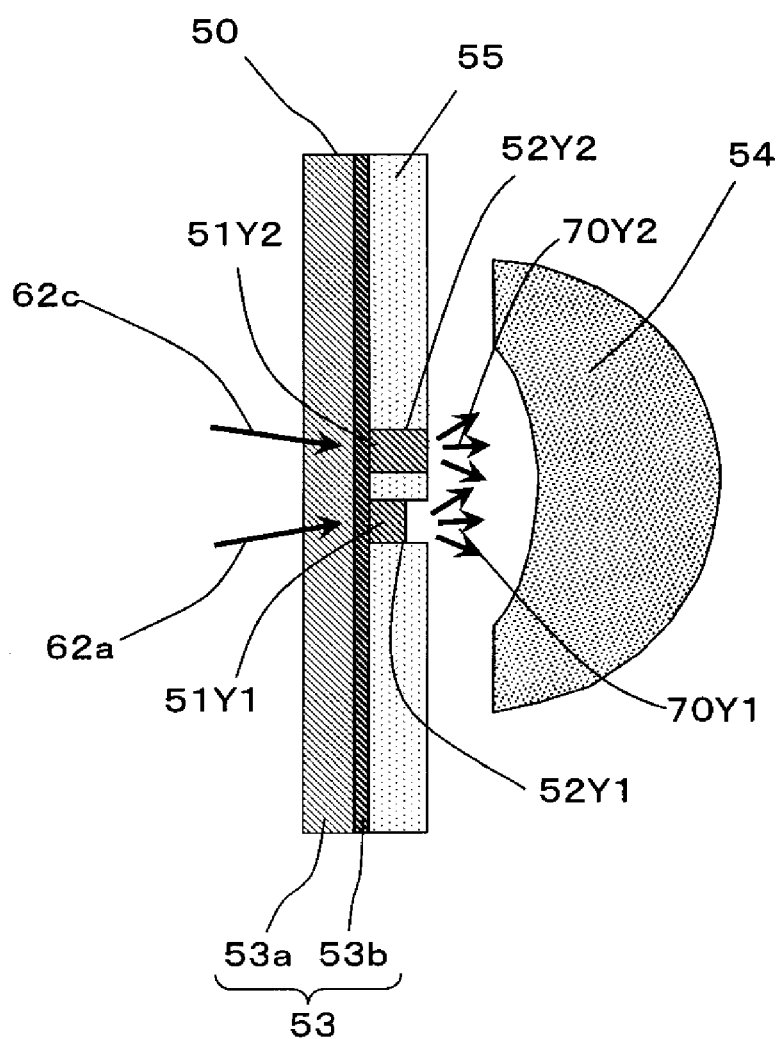
FIG. 5 is a schematic view illustrating a light conversion element according to a modification example of an illumination apparatus in Embodiment 1 of the disclosure.

Sequentially, a modification example of Embodiment 1 will be described with reference to FIG. 5. Only different portions of an illumination apparatus in the modification example from the above illumination apparatus will be described. In the modification example, configurations of light conversion element 50 and second condensing lens 54 are different from the above configurations. Light conversion element 50 includes base 55, first through-hole 52Y1, and second through-hole 52Y2 which are provided in base 55.

First light converter 51Y1 is embedded in first through-hole 52Y1 and second light converter 51Y2 is embedded in second through-hole 52Y2. First light converter 51Y1 and second light converter 51Y2 contain phosphor converting light of which a main wavelength range of a wavelength is 420 nm to 500 nm into light of which a main wavelength range of a wavelength is 550 nm to 700 nm. First light converter 51Y1 and second light converter 51Y2 are configured by mixing the phosphor described above with binder configured of, for example, an organic material such as silicone and epoxy, an inorganic material such as low-melting point glass, aluminum oxide, and zinc oxide. As specific examples of the phosphor, Ce-activated garnet crystal phosphor ((Y, Gd)$_3$(Ga, Al)$_5$O$_{12}$:Ce$^{3+}$ phosphor), Eu-activated (Ba, Sr)Si$_2$O$_2$N$_2$ phosphor and the like are included. As illustrated in FIG. 5, first light converter 51Y1 and second light converter 51Y2 are set, for example, in different thicknesses.

In the configuration described above, first emitted light 62a enters first light converter 51Y1. The wavelength range of some of first emitted light 62a is converted by the phosphor of first light converter 51Y1. Second emitted light 62c enters second light converter 51Y2. The wavelength range of some of second emitted light 62c is converted by the phosphor of second light converter 51Y2. First radiation light 70Y1 radiated from first light converter 51Y1 is light that is obtained by mixing light of which a main wavelength range is 550 nm to 700 nm and light of which a main wavelength range 420 nm to 500 nm. A color temperature of first radiation light 70Y1 is 5500K and first radiation light 70Y1 has the emission spectrum as illustrated in FIG. 3A. Second radiation light 70Y2 radiated from second light converter 51Y2 is light that is obtained by mixing light of which a main wavelength range is 550 nm to 700 nm and light of which a main wavelength range 420 nm to 500 nm. A color temperature of second radiation light 70Y2 is 4300K and second radiation light 70Y2 has the emission spectrum as illustrated in FIG. 3C. In this case, first power applied to first optical waveguide 12a and second power applied to second optical waveguide 12c of semiconductor light-emitting element 11 are independently changed, and a power ratio of first power and second power is changed. As a result, it is possible to change an intensity ratio of first radiation light 70Y1 and second radiation light 70Y2, and to change the color temperature of the light emitted from illumination apparatus 1.

In the modification example, a surface of second condensing lens 54 on light conversion element 50 side is a concave surface. In the modification example, a case where a thickness of first light converter 51Y1 and a thickness of second light converter 51Y2 are different is described, but the invention is not limited to the modification example. For example, a configuration, in which the color temperature of the emitted light of illumination apparatus 1 is changed, may be provided by allowing a concentration of the phosphor with respect to the binder in first light converter 51Y1 and a concentration of the phosphor with respect to the binder in second light converter 51Y2 to be different. A configuration, in which the color temperature of the emitted light of illumination apparatus 1 is changed, may be provided by allowing a type of the binder used in first light converter 51Y1 and a type of the binder used in second light converter 51Y2 to be different. A configuration, in which the color temperature of the emitted light of illumination apparatus 1 is changed, may be provided by allowing compositions of the phosphor used in first light converter 51Y1 and compositions of the phosphor used in second light converter 51Y2 to be different.

Embodiment 2

Hereinafter, illumination apparatus 101 in Embodiment 2 of the disclosure will be described with reference to FIGS. 6 to 9. In the embodiment, only different portions from the illumination apparatus 1 of Embodiment 1 will be described.

Figure 6:
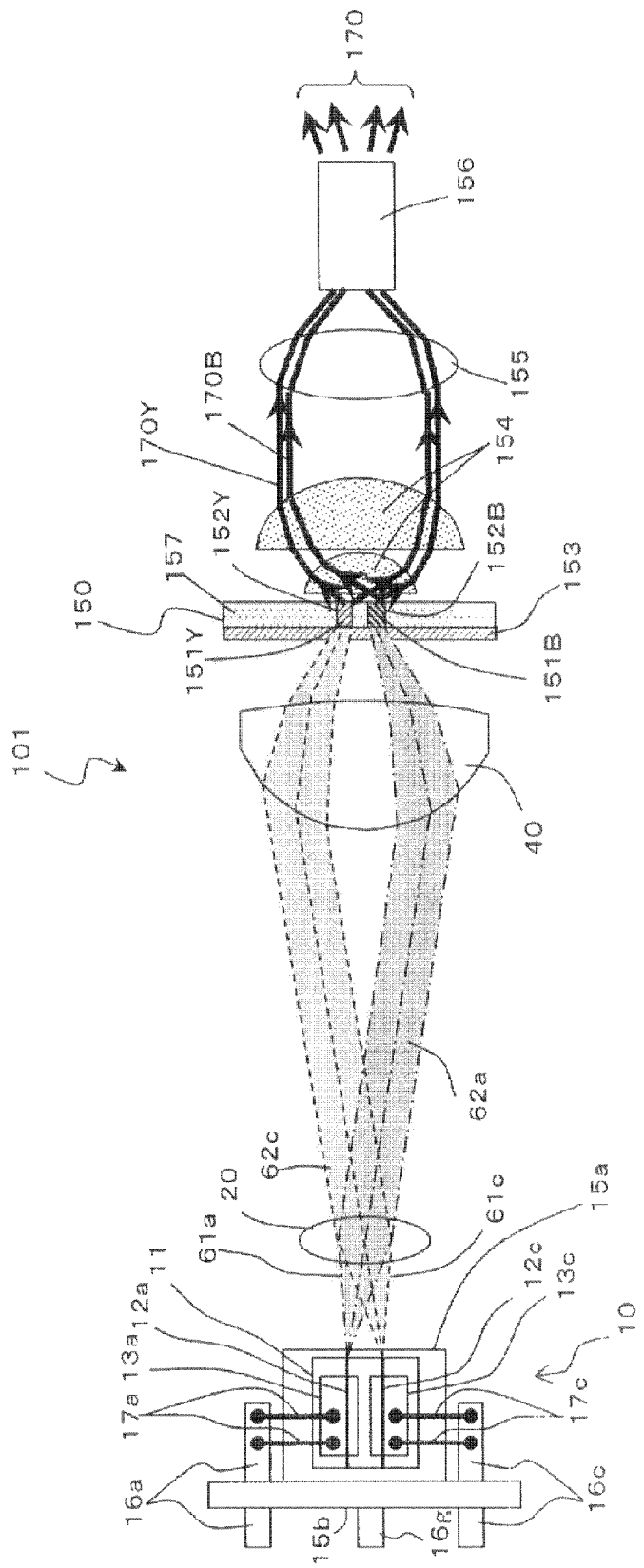
FIG. 6 is a schematic view illustrating a configuration of an illumination apparatus in Embodiment 2 of the disclosure.
Figure 7:
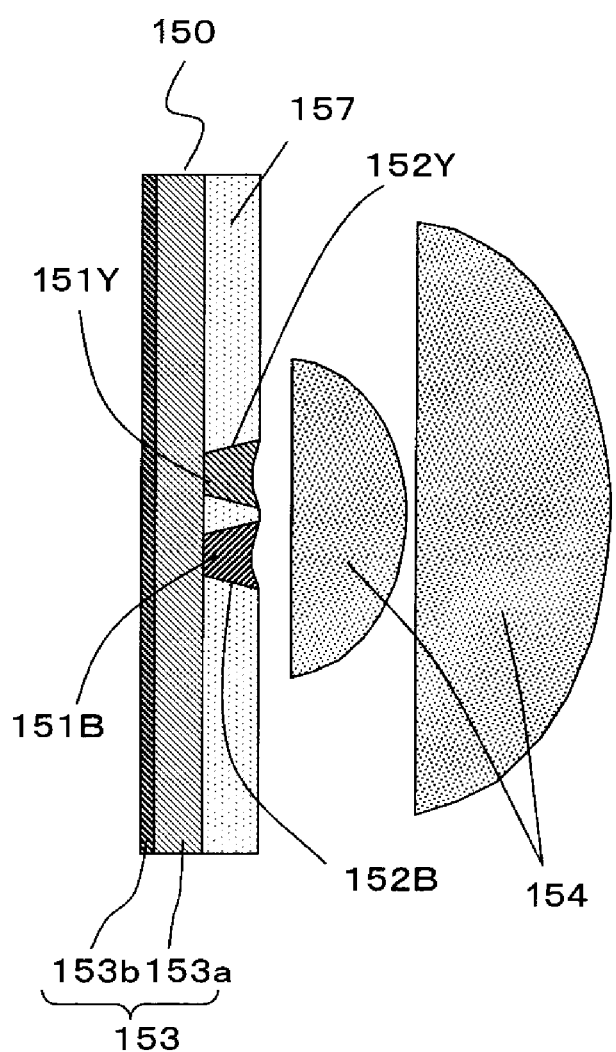
FIG. 7 is a schematic view illustrating a light conversion element and a second condensing lens of the illumination apparatus in Embodiment 2 of the disclosure.

FIG. 6 is a schematic view illustrating a structure of illumination apparatus 101 in Embodiment 2. FIG. 7 is a schematic view illustrating light conversion element 150 and second condensing lens 154 of illumination apparatus 101. In the embodiment, light conversion element 150 has first light converter 151B and second light converter 151Y. First light converter 151B has a phosphor of which a range of an emission wavelength is 430 nm to 500 nm. Second light converter 151Y has a phosphor of which a range of an emission wavelength is 520 nm to 700 nm. First emitted light 61a and second emitted light 61c emitted from semiconductor light-emitting element 11 have a wavelength range of 380 nm to 430 nm.

Light conversion element 150 has base 157 formed of, for example, aluminum alloy material plate, first through-hole 152B, and second through-hole 152Y provided in base 157. First light converter 151B is embedded in first through-hole 152B. Second light converter 151Y is embedded in second through-hole 152Y. First light converter 151B and second light converter 151Y have the phosphor and binder to which the phosphor is mixed. The binder is formed of, for example, an organic transparent material such as silicone, an inorganic transparent material such as glass having low melting point, and the like. Dichroic mirror 153 is provided on a surface of semiconductor light-emitting element 11 side in base 157 of light conversion element 150. Dichroic mirror 153 has glass 153a and dielectric multilayer film 153b provided on glass 153a. Glass 153a comes into contact with base 157. Dielectric multilayer film 153b transmits light of, for example, a wavelength of 430 nm or less and reflects light of a wavelength of 430 nm or more. Second condensing lens 154 is disposed on a side opposite to semiconductor light-emitting element 11 in base 157. Second condensing lens 154 is configured of a transparent glass and has a sufficiently larger radius of curvature than a region in which first light converter 151B and second light converter 151Y are disposed. In the embodiment, second condensing lens 154 is described as a lens of two piece sets, but the invention is not limited to the embodiment.

It is preferable that the phosphor provided in first light converter 151B is a so-called blue phosphor having, for example, a fluorescent peak between 430 nm to 500 nm of the wavelength. Specific phosphors provided in first light converter 151B are, for example, $Sr_3MgSi_2O_8:Eu^{2+}$ phosphor, $(Sr, Ba)_3MgSi_2O_8:Eu^{2+}$ phosphor, $BaMgAl_{10}O_{17}:Eu^{2+}$ phosphor, $(Sr, Ca, Ba, Mg)_{10}(PO_4)_6Cl_2:Eu^{2+}$ phosphor, and the like. It is preferable that the phosphor provided in second light converter 151Y is a so-called yellow phosphor having, for example, a fluorescent peak between 540 nm to 610 nm of the wavelength. Specific phosphors provided in second light converter 151Y are, for example, $Sr_3SiO_5:Eu^{2+}$ phosphor, $(Ca_{1-x}Sr_x)_7(SiO_3)_6Cl_2:Eu^{2+}$ phosphor, $(Y, Gd)_3(Al, Ga)_5O_{12}:Ce^{3+}$ phosphor, $(Ba, Sr)Si_2O_2N_2:Eu^{2+}$ phosphor, and the like.

First emitted light 62a enters first light converter 151B with good position accuracy by an optical magnification of collimator lens 20 and condensing lens 40. Second emitted light 62c enters second light converter 151Y with good position accuracy by an optical magnification of collimator lens 20 and condensing lens 40. Incident of first emitted light 62a on first light converter 151B and incident of second emitted light 62c on second light converter 151Y can be performed simultaneously. First light converter 151B emits first radiation light 170B that is, for example, blue light and second light converter 151Y emits second radiation light 170Y that is, for example, yellow light. Second condensing lens 154 and third condensing lens 155 condense first radiation light 170B and second radiation light 170Y. The condensed first radiation light 170B and second radiation light 170Y enter rod integrator 156, colors thereof are mixed on an inside of rod integrator 156, and are radiated by illumination apparatus 101 as white light 170.

Functions and Effects

In the configuration described above, first emitted light 61a emitted from semiconductor light-emitting element 11 can enter first light converter 151B with good position accuracy and second emitted light 61c can enter second light converter 151Y with good position accuracy simultaneously. For example, first light converter 151B has the blue phosphor and second light converter 151Y has the yellow phosphor, and thereby it is possible to emit the blue light from first light converter 151B and emit the yellow light from second light converter 151Y. Thus, it is possible to easily control the color temperature, spectrum of white light 170, and the like by controlling the intensity ratio of first emitted light 61a emitted from first optical waveguide 12a and second emitted light 61c emitted from second optical waveguide 12c of semiconductor light-emitting element 11. Even after configuring illumination apparatus 101, it is possible to change the color temperature of white light 170 emitted from illumination apparatus 101 by changing the intensity ratio of first emitted light 61a and second emitted light 61c.

Base 157 configuring light conversion element 150 is made of a material that, for example, reflects visible light such as aluminum alloy material. First light converter 151B is embedded in first through-hole 152B provided within base 157. Second light converter 151Y is embedded in second through-hole 152Y provided within base 157. Thus, for example, first radiation light 170B radiated from first light converter 151B is not absorbed by the phosphor included in second light converter 151Y. That is, first radiation light 170B can be suppressed to be reabsorbed by second light converter 151Y, second radiation light 170Y can be suppressed to be reabsorbed by first light converter 151B, and emission efficiency can be suppressed to be lowered. As a result, first radiation light 170B from first light converter 151B and second radiation light 170Y from second light converter 151Y can be efficiently taken out to the outside of illumination apparatus 101. Thus, illumination apparatus 101 can efficiently emit white light 170 with high emission efficiency.

Figure 8:
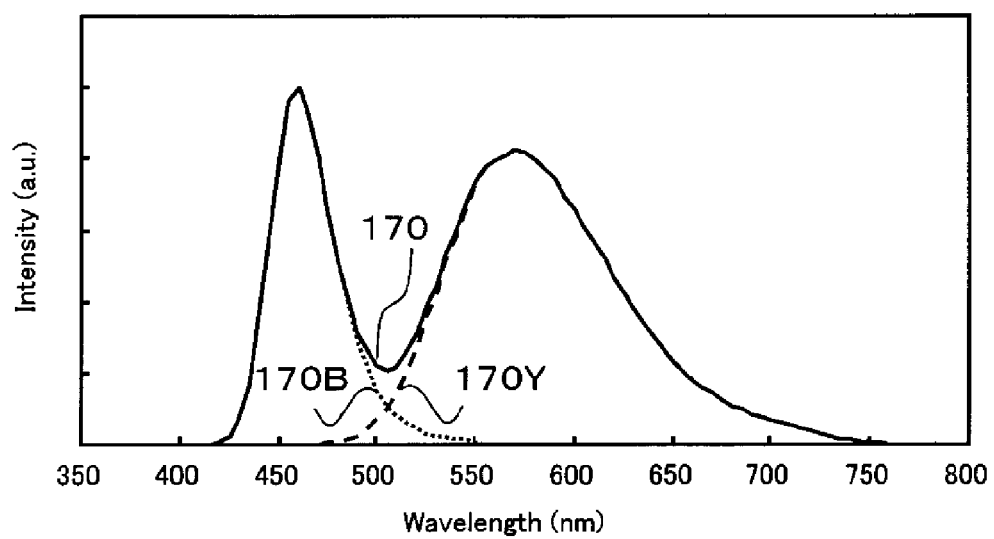
FIG. 8 is a graph illustrating an emission spectrum of the illumination apparatus in Embodiment 2 of the disclosure.

The above effects will be described with reference to FIGS. 8 and 9 in detail. FIG. 8 illustrates the spectra of first radiation light 170B, second radiation light 170Y, and white light 170 of which the color temperature is approximately 5000K. As conditions for obtaining the spectrum view illustrated in FIG. 8, excitation light is the laser light of which a wavelength is 405 nm, the phosphor configuring first light converter 151B is $Sr_3MgSi_2O_8:Eu^{2+}$ phosphor, and the phosphor configuring second light converter 151Y is $(Ba, Sr)Si_2O_2N_2:Eu^{2+}$ phosphor.

Figure 9:
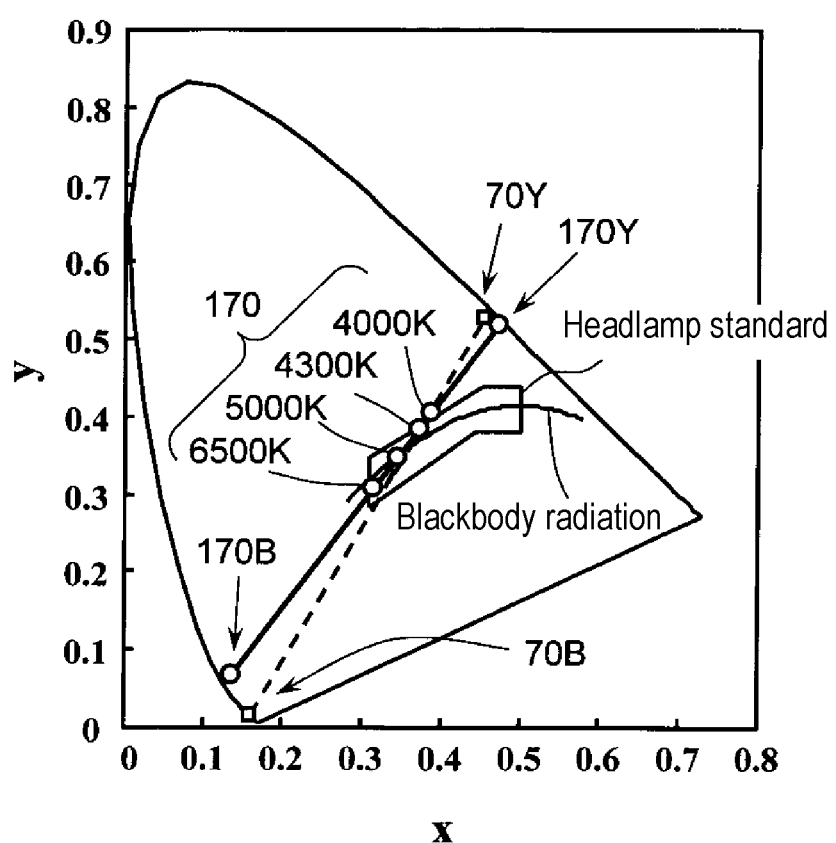
FIG. 9 is a chromaticity diagram illustrating light emission characteristics of the illumination apparatus in Embodiment 2 of the disclosure.

A solid line in FIG. 9 represents a chromaticity that can be realized by changing the intensity ratio of first radiation light 170B emitted from first light converter 151B and second radiation light 170Y emitted from second light converter 151Y in the configuration described above. Further, in order to compare with spectrum characteristics illustrated in Embodiment 1 a broken line in FIG. 9 represents a chromaticity that can be realized by the configuration illustrated in Embodiment 1. It is understood from the chromaticity view of FIG. 9 that the color temperature of the light emitted from illumination apparatus 101 can be realized in a range between 4300K and 6500K by using illumination apparatus 101 illustrated in the embodiment. As illustrated in FIG. 9, it is understood that the light emitted from illumination apparatus 101 realizes the chromaticity close to blackbody radiation in a range wider than the emitted light of Embodiment 1.

Modification Example

Figure 10A:
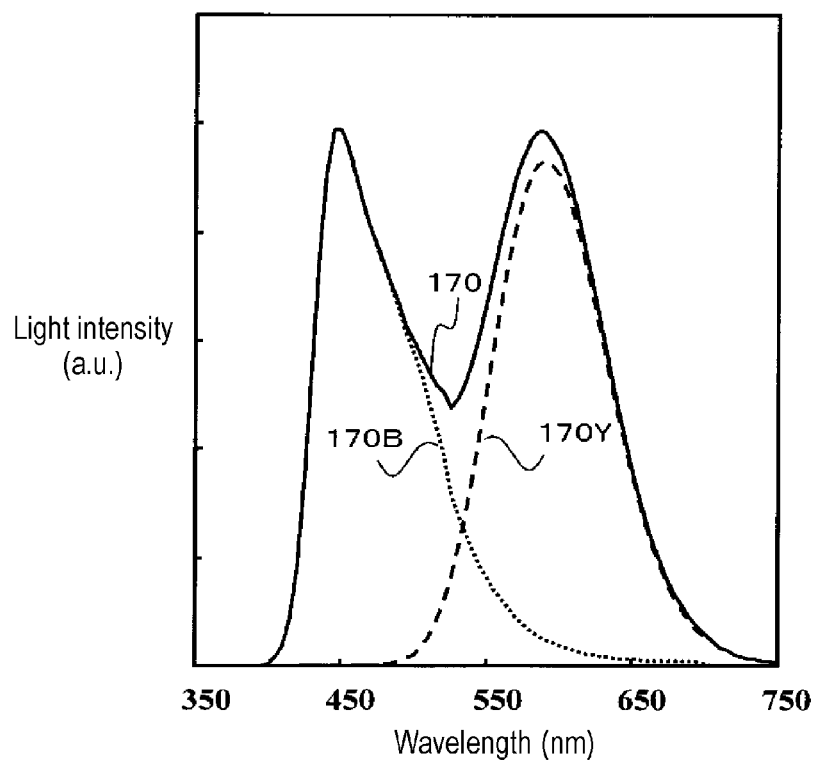
FIG. 10A is a graph illustrating an emission spectrum according to a modification example of an illumination apparatus in Embodiment 2 of the disclosure.
Figure 10B:
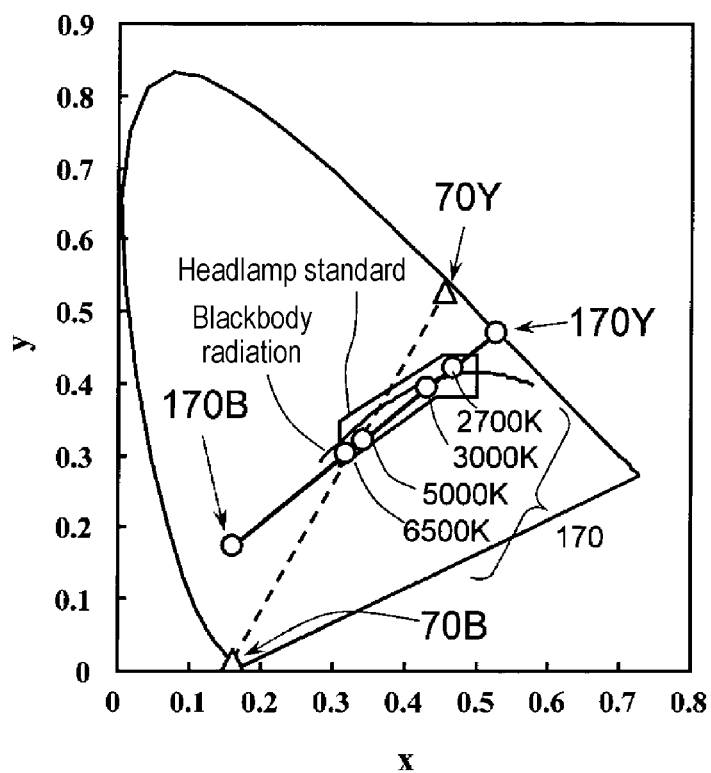
FIG. 10B is a chromaticity diagram illustrating light emission characteristics of the modification example of the illumination apparatus in Embodiment 2 of the disclosure.

Sequentially, a modification example of Embodiment 2 will be described with reference to FIGS. 10A and 10B. A configuration illustrated in the modification example is different in a phosphor material included in first light converter 151B and second light converter 151Y with respect to the configuration described above. In the modification example, a main emission wavelength range of the phosphor included in first light converter 151B is 430 nm to 550 nm and emission color of the phosphor is blue-green. Specific phosphor material is, for example, $(Sr, Ba, Ca)_5(PO_4)_3Cl:Eu^{2+}$ phosphor, $(Ba, Sr)_3Mg_3Si_2O_8:Eu^{2+}$ phosphor, and the like. Furthermore, in the modification example, a main emission wavelength range of the phosphor included in second light converter 151Y is 550 nm to 650 nm and emission color of the phosphor is orange. Specifically, the phosphor material is, for example, $(Ba, Sr)SiO_4:Eu^{2+}$ phosphor, $(Ba, Sr)Si_2O_2N_2:Eu^{2+}$ phosphor, α-SiAlON:$Eu^{2+}$ phosphor, $(Sr, Ca) AlSiN_3:Eu^{2+}$ phosphor, and the like. In this case, the spectrum of white light 170 of which the color temperature is 5000K is illustrated in a solid line of FIG. 10A. A chromaticity range that can be realized by changing a ratio of first radiation light 170B from first light converter 151B and second radiation light 170Y from second light converter 151Y is illustrated in a solid line of FIG. 10B. That is, a chromaticity adjustment range of the modification example can be set in a wide range of the color temperature of 2700K to 6500K. Since the chromaticity adjustment range can be changed in a region close to the blackbody radiation, it is possible to further widen the chromaticity adjustment range.

Embodiment 3

Hereinafter, illumination apparatus 201 in Embodiment 3 of the disclosure will be described with reference to FIG. 11. In the embodiment, only different portions from the illumination apparatus 1 of Embodiment 1 will be described.

Figure 11:
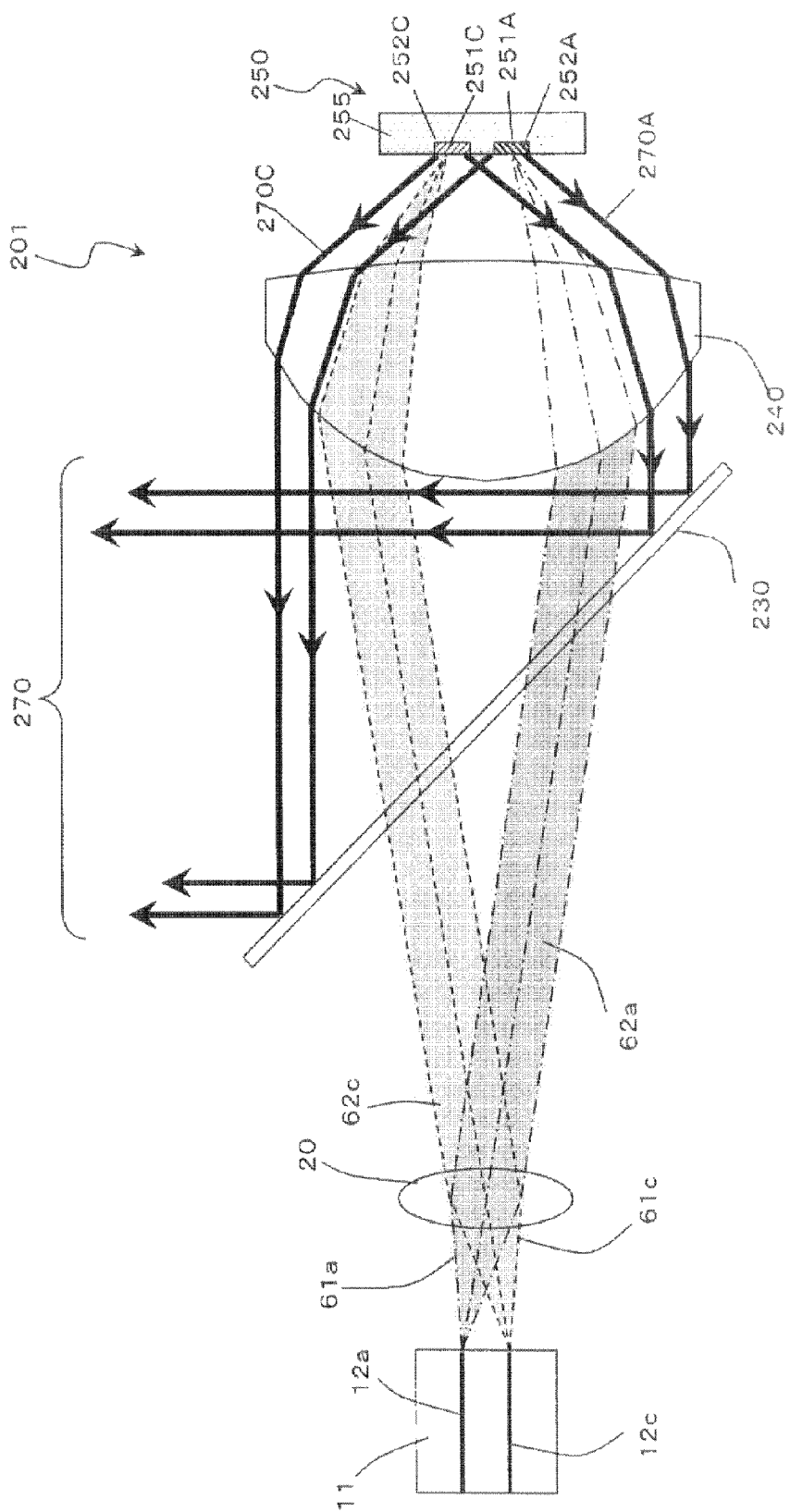
FIG. 11 is a schematic view illustrating a configuration of an illumination apparatus in Embodiment 3 of the disclosure.

FIG. 11 is a view illustrating a structure of the illumination apparatus 201 in Embodiment 3. In illumination apparatus 201 of the embodiment, configurations or functions of light conversion element 250, condensing lens 240, and dichroic mirror 230 are mainly different from those of illumination apparatus 1 of Embodiment 1.

Light conversion element 250 has base 255 made of, for example, aluminum alloy and the like, first opening unit 252A, and second opening unit 252C provided on semiconductor light-emitting element 11 side in base 255. First light converter 251A including a phosphor is embedded in first opening unit 252A and second light converter 251C including a phosphor is embedded in second opening unit 252C. Semiconductor light-emitting element 11 has first optical waveguide 12a and second optical waveguide 12c, and emits the laser light of which a wavelength is, for example, 405 nm. First light converter 251A is configured by using the blue phosphor described in Embodiment 1 and Embodiment 2. Second light converter 251C is configured by using the yellow phosphor described in Embodiment 1 and Embodiment 2. Collimator lens 20, dichroic mirror 230, and condensing lens 240 are disposed between semiconductor light-emitting element 11 and light conversion element 250.

First emitted light 61a emitted from first optical waveguide 12a becomes first emitted light 62a collimated by collimator lens 20. Second emitted light 61c emitted from second optical waveguide 12c becomes second emitted light 62c collimated by collimator lens 20. First emitted light 62a and second emitted light 62c pass through dichroic mirror 230 and enter the vicinity of a center portion in a pupil of condensing lens 240. First emitted light 62a and second emitted light 62c are condensed by condensing lens 240. Condensed first emitted light 62a enters first light converter 251A of light conversion element 250 with good accuracy. Condensed second emitted light 62c enters second light converter 251C of light conversion element 250 with good accuracy. Incident of first emitted light 62a on first light converter 251A is performed simultaneously with incident of second emitted light 62c on second light converter 251C.

In first light converter 251A, first emitted light 62a is, for example, converted into first radiation light 270A that is blue light. In second light converter 251C, second emitted light 62c is, for example, converted into second radiation light 270C that is yellow light.

First radiation light 270A and second radiation light 270C reflect on condensing lens 240 by base 255.

First radiation light 270A and second radiation light 270C are condensed by condensing lens 240. First radiation light 270A and second radiation light 270C are mixed within condensing lens 240 and then become white light 270. White light 270 is reflected on the outside of illumination apparatus 201 by dichroic mirror 230. Dichroic mirror 230 has a glass plate and a dielectric multilayer film provided on the glass plate. The dielectric multilayer film transmits light of, for example, a wavelength of 430 nm or less of the light incident from a direction of 45° with respect to a film forming surface and reflects light of a wavelength of 430 nm or more.

Functions and Effects

According to such a configuration, first emitted light 61a emitted from first optical waveguide 12a enters first light converter 251A with high accuracy. Second emitted light 61c emitted from second optical waveguide 12c enters second light converter 251C with high accuracy. First radiation light 270A radiated from first light converter 251A is radiated from illumination apparatus 201 without incident on another light converter. Second radiation light 270C radiated from second light converter 251C is radiated from illumination apparatus 201 without incident on another light converter. Thus, first radiation light 270A and second radiation light 270C can be suppressed to be reabsorbed by the phosphor and as a result, it is possible to improve efficiency of illumination apparatus 201. First radiation light 270A and second radiation light 270C are radiated from a very small region. As a result, emission efficiency is good and it is possible to obtain white light 270 having high coupling efficiency with an optical system arranged in a subsequent stage. First power applied to first optical waveguide 12a and second power applied to second optical waveguide 12c are independently changed, and power ratio of first power and second power is changed. Thus, it is possible to change the color temperature of white light 270.

A configuration may be provided in which the wavelength ranges of first emitted light 61a and second emitted light 61c from semiconductor light-emitting element 11 are between 430 nm and 500 nm, and first emitted light 61a and second emitted light 61c are blue light. In this case, first light converter 251A of light conversion element 250 is configured of a light converter that lowers coherence of the emitted light and second light converter 251C is configured of a light converter in which the wavelength of light of some or all of the emitted light is changed by the phosphor. According to the configuration, since coherence of first emitted light 61a can be lowered, it is possible to reduce interference noise of first emitted light 61a and to use some of first emitted light 61a as the radiation light.

Embodiment 4

Figure 12:
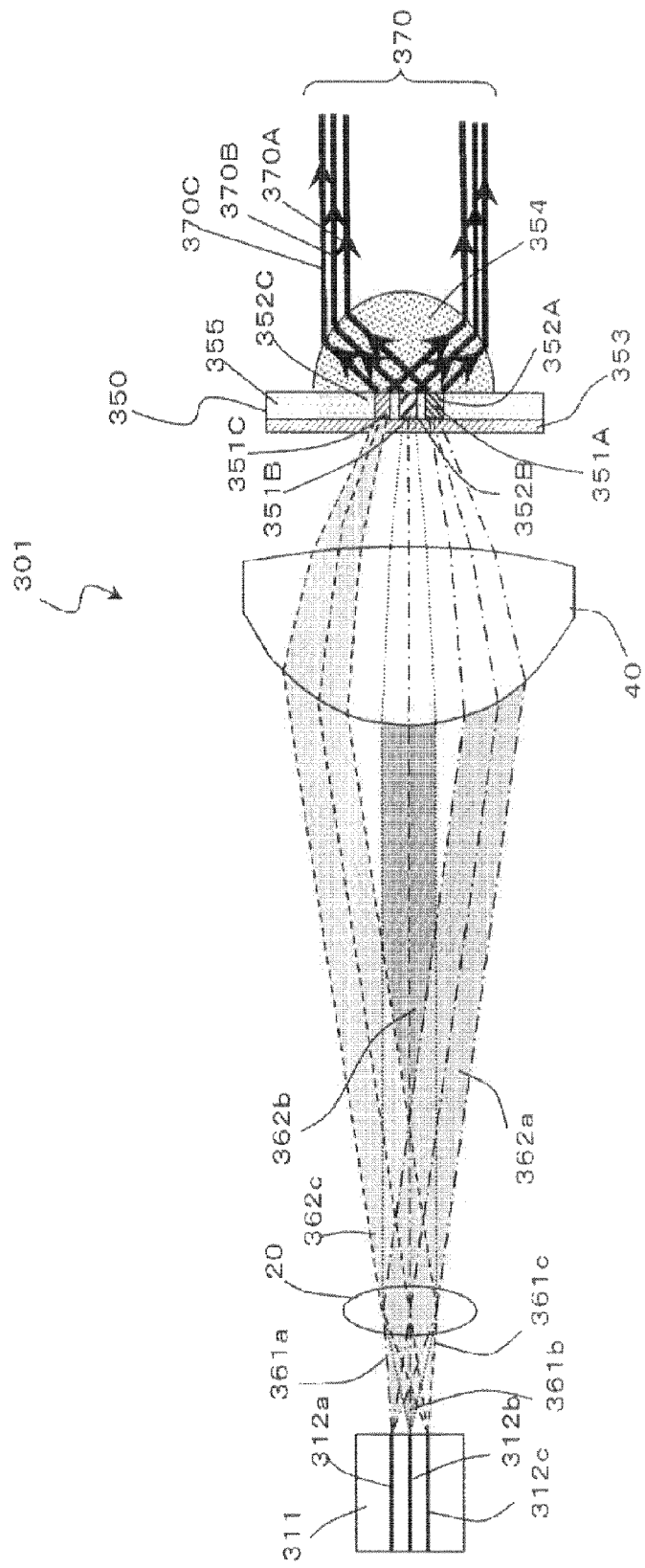
FIG. 12 is a schematic view illustrating a configuration of an illumination apparatus in Embodiment 4 of the disclosure.
Figure 13:
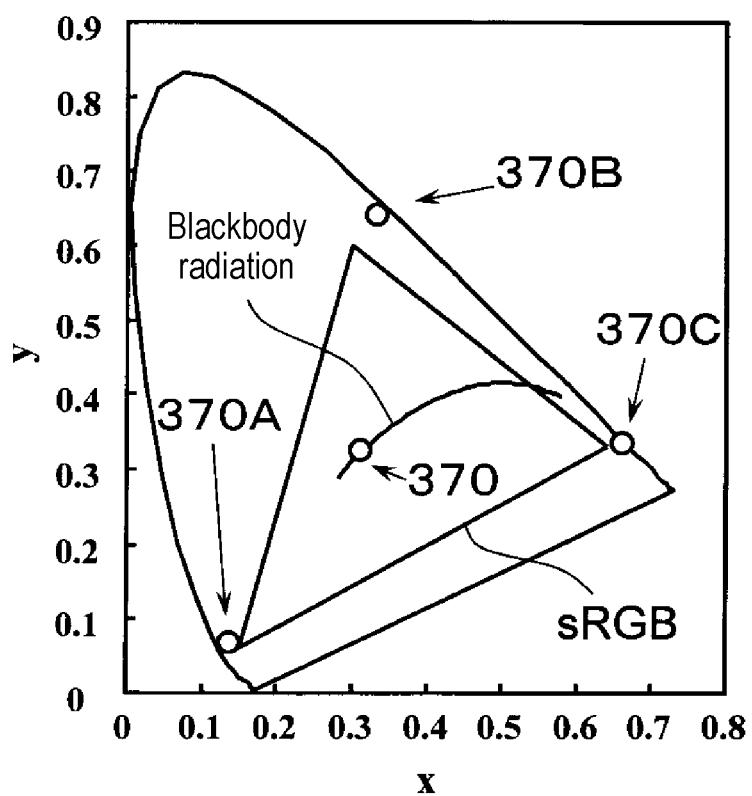
FIG. 13 is a chromaticity diagram illustrating light emission characteristics of an illumination apparatus in Embodiment 4 of the disclosure.

Sequentially, illumination apparatus 301 in Embodiment 4 of the disclosure will be described with reference to FIGS. 12 and 13. In the embodiment, only different portions from those in Embodiment 2 will be described.

Semiconductor light-emitting element 311 in the embodiment includes first optical waveguide 312a, second optical waveguide 312b, and third optical waveguide 312c, and light conversion element 350 includes first light converter 351A, second light converter 351B, and third light converter 351C.

First optical waveguide 312a emits first emitted light 361a, second optical waveguide 312b emits second emitted light 361b, and third optical waveguide 312c emits third emitted light 361c. Wavelengths of first emitted light 361a, second emitted light 361b, and third emitted light 361c are, for example, 405 nm. First emitted light 361a is collimated by collimator lens 20 and becomes first emitted light 362a. Second emitted light 361b is collimated by collimator lens 20 and becomes second emitted light 362b. Third emitted light 361c is collimated by collimator lens 20 and becomes third emitted light 362c. First emitted light 361a, second emitted light 361b, and third emitted light 361c enter the vicinity of a center portion in a pupil of condensing lens 40, are condensed by condensing lens 40, and enter light converter 350. Light converter 350 includes base 355 and dichroic mirror 353 disposed by coming into contact with base 355, and dichroic mirror 353 is disposed on semiconductor light-emitting element 311 side. First emitted light 362a transmits dichroic mirror 353 and enters first light converter 351A. Second emitted light 362b transmits dichroic mirror 353 and enters second light converter 351B. Third emitted light 362c transmits dichroic mirror 353 and enters third light converter 351C. First emitted light 362a is converted into first radiation light 370A that is, for example, is red light by first light converter 351A. Second emitted light 362b is converted into second radiation light 370B that is, for example, is green light by second light converter 351B. Third emitted light 362c is converted into third radiation light 370C that is, for example, is blue light by third light converter 351C. Lens 354 is disposed on a side opposite to semiconductor light-emitting element 311 with respect to base 355. First radiation light 370A is reflected by a side wall of first through-hole 352A provided in base 355 and dichroic mirror 353, and enters lens 354. Second radiation light 370B is reflected by a side wall of second through-hole 352B provided in base 355 and dichroic mirror 353, and enters lens 354. Third radiation light 370C is reflected by a side wall of third through-hole 352C provided in base 355 and dichroic mirror 353, and enters lens 354. First radiation light 370A, second radiation light 370B, and third radiation light 370C are mixed within lens 354, becomes white light 370 that is substantially parallel light, and emitted to the outside of illumination apparatus 301.

Functions and Effects

According to such a configuration, first emitted light 361a emitted from first optical waveguide 312a enters first light converter 351A with high accuracy. Second emitted light 361b emitted from second optical waveguide 312b enters second light converter 351B with high accuracy. Third emitted light 361c emitted from third optical waveguide 312c enters third light converter 351C with high accuracy. First radiation light 370A radiated from first light converter 351A, second radiation light 370B radiated from second light converter 351B, and third radiation light 370C radiated from third light converter 351C are emitted from illumination apparatus 301 without incident on another light converter. Thus, first radiation light 370A, second radiation light 370B, and third radiation light 370C can be suppressed to be reabsorbed by the phosphor and as a result, it is possible to improve efficiency of illumination apparatus 301. First radiation light 370A, second radiation light 370B, and third radiation light 370C are radiated from a very small region. As a result, emission efficiency is good and it is possible to obtain white light 370 having high coupling efficiency with an optical system arranged in a subsequent stage. First power applied to first optical waveguide 312a, second power applied to second optical waveguide 312b, and third power applied to third optical waveguide 312c are independently changed, and a power ratio of first power, second power, and third power is changed. Thus, it is possible to change the chromaticity of white light 370. FIG. 13 illustrates a chromaticity range that can be realized by using first radiation light 370A, second radiation light 370B, and third radiation light 370C. In order to obtain first radiation light 370A, first light converter 351A has $Sr_3MgSi_2O_8:Eu^{2+}$ phosphor. In order to obtain second radiation light 370B, second light converter 351B has $\beta\text{-SiAlON}:Eu^{2+}$ phosphor. In order to obtain third radiation light 370C, third light converter 351C has $CaAlSiN_3:Eu^{2+}$ phosphor. The chromaticity of white light 370 can be changed in a range of a triangle surrounded by a chromaticity point of first radiation light 370A, a chromaticity point of second radiation light 370B, and a chromaticity point of third radiation light 370C.

In the embodiment, it is configured such that wavelengths of first emitted light 361a, second emitted light 361b, and third emitted light 361c emitted from semiconductor light-emitting element 311 are 405 nm, light conversion element 350 has first light converter 351A, second light converter 351B, and third light converter 351C, and the phosphors included in first light converter 351A, second light converter 351B, and third light converter 351C determine the chromaticity range of the emitted light from illumination apparatus 301. However, semiconductor light-emitting element 311 has four or more of the optical waveguides and the light converters, and may be configured to further freely adjust the chromaticity of the emitted light. Furthermore, it may be a light converter in which the wavelength range of the light emitted from semiconductor light-emitting element 311 is set to be 430 nm to 500 nm and at least one of a plurality of light converters lowers the coherence of the light emitted from semiconductor light-emitting element 311.

Fifth Embodiment

Figure 14:
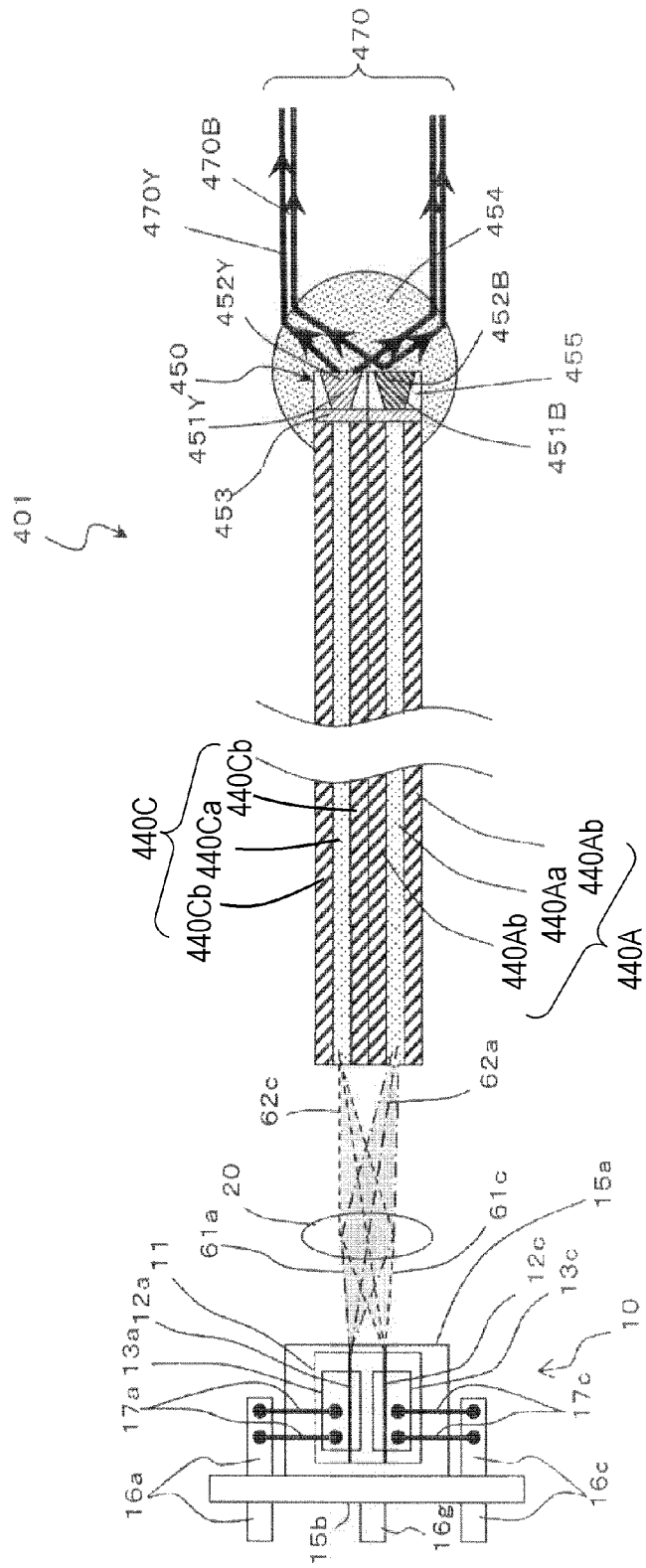
FIG. 14 is a schematic view illustrating a configuration of an illumination apparatus in Embodiment 5 of the disclosure.
Figure 15:
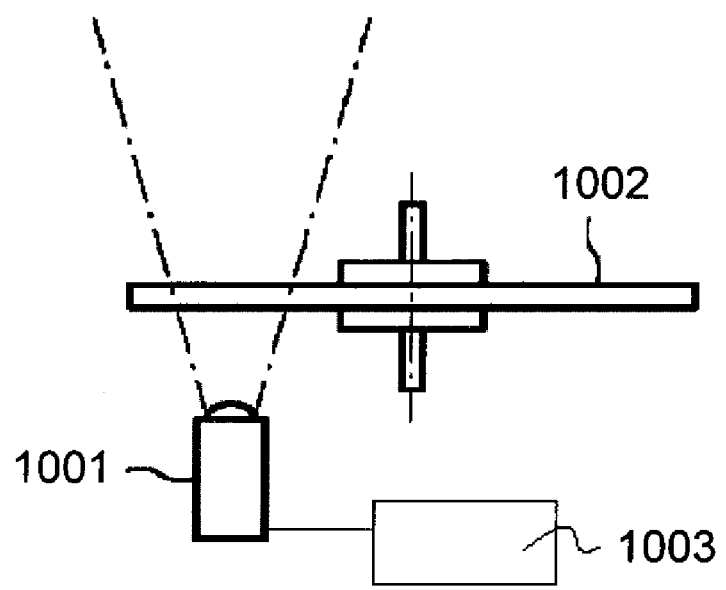
FIG. 15 is a schematic view illustrating a configuration of an illumination apparatus of the related art.

Sequentially, illumination apparatus 401 in Embodiment 5 of the disclosure will be described with reference to FIG. 14. In the embodiment, only different portions from those in Embodiment 2 will be described. In the embodiment, semiconductor light-emitting element 11 has a plurality of optical waveguide and light conversion element 450 has a plurality of light converters. Illumination apparatus 401 has first optical fiber 440A and second optical fiber 440C, and first optical fiber 440A and second optical fiber 440C transmit emitted light from the plurality of optical waveguides to the plurality of light converters. Hereinafter, a specific configuration will be described.

In the embodiment, semiconductor light-emitting element 11 has first optical waveguide 12a and second optical waveguide 12c, and light conversion element 450 has first light converter 451B and second light converter 451Y. Illumination apparatus 401 has first optical fiber 440A and second optical fiber 440C. First optical fiber 440A transmits first emitted light 61a from first optical waveguide 12a to first light converter 451B and second optical fiber 440C transmits second emitted light 61c from second optical waveguide 12c to second light converter 451Y. First optical fiber 440A includes first core 440Aa and first clad 440Ab having a refractive index different from a refractive index of first core 440Aa. Second optical fiber 440C includes second core 440Ca and second clad 440Cb having a refractive index different from a refractive index of second core 440Ca. First optical fiber 440A is disposed between first optical waveguide 12a and first light converter 451B, and second optical fiber 440C is disposed between second optical waveguide 12c and second light converter 451Y.

Light conversion element 450 includes transparent substrate 453 and base 455 provided on transparent substrate 453. Transparent substrate 453 is disposed on semiconductor light-emitting element 11 side with respect to base 455. Transparent substrate 453 is formed of, for example, glass, sapphire, and aluminum nitride. Base 455 is made of aluminum alloy plate. Base 455 has first through-hole 452B and second through-hole 452Y. First light converter 451B is provided in first through-hole 452B and second light converter 451Y is provided in second through-hole 452Y.

One optical fiber may have two cores, first light converter 451B corresponds to one core and second light converter 451Y may correspond to the other core.

Semiconductor light-emitting element 11 may have three or more optical waveguides, light conversion element 450 may have three or more light converters, and three or more optical fibers may connect between semiconductor light-emitting element 11 and light conversion element 450. Optical fibers having a plurality of cores may connect between semiconductor light-emitting element 11 and light conversion element 450 by using one or a plurality of optical fibers.

Functions and Effects

First optical waveguide 12a of semiconductor light-emitting element 11 emits first emitted light 61a and second optical waveguide 12c emits second emitted light 61c. First emitted light 61a and second emitted light 61c are laser light of which a wavelength is, for example, 405 nm. First emitted light 61a and second emitted light 61c are collimated by collimator lens 20 and become first emitted light 62a and second emitted light 62c. First emitted light 62a enters first core 440Aa of first optical fiber 440A and simultaneously second emitted light 62c enters second core 440Ca of second optical fiber 440C. First emitted light 62a propagated through first core 440Aa enters first light converter 451B of light conversion element 450 mounted on a side opposite to semiconductor light-emitting element 11 with respect to first optical fiber 440A. Second emitted light 62c propagated through second core 440Ca enters second light converter 451Y of light conversion element 450 mounted on a side opposite to semiconductor light-emitting element 11 with respect to second optical fiber 440C. First emitted light 62a incident on first light converter 451B is converted into first radiation light 470B that is, for example, blue light. Second emitted light 62c incident on second light converter 451Y is converted into second radiation light 470Y that is, for example, yellow light. First radiation light 470B and second radiation light 470Y enter spherical lens 454. First radiation light 470B and second radiation light 470Y are mixed in spherical lens 454, become white light 470 having high direction, and are emitted from illumination apparatus 401.

According to such a configuration, first radiation light 470B can be suppressed to be reabsorbed in second light converter 451Y and second radiation light 470Y can be suppressed to be reabsorbed in first light converter 451B. Thus, it is possible to emit white light 470 with high luminance. First power applied to first optical waveguide 12a and second power applied to second optical waveguide 12c are independently changed, and then it is possible to change a power ratio of first power and second power. As a result, it is possible to change the color temperature of white light 470.

A wavelength range of first emitted light 61a may be between 430 nm and 500 nm, and first emitted light 61a may be blue light. In this case, first light converter 451B is configured of a transparent member a surface of which has irregularities. The transparent member lowers the coherence of first emitted light 61a from semiconductor light-emitting element 11. According to the configuration, since first light converter 451B lowers the coherence of first emitted light 61a, it is possible to reduce interference noise of first emitted light 61a and to use some of first emitted light 61a as the radiation light.

The above configuration can be applied to the illumination apparatus of the first to third embodiments in addition to the fifth embodiment.

In the first to fifth embodiments, an example, in which the material configuring the base of the light conversion element is aluminum alloy, is described, but the disclosure is not limited to the example. In order to exhaust heat generated by the phosphor of the light converter, it is preferable that the material of the base is a material having high thermal conductivity. It is preferable that the material of the base is one that reflects visible light radiated from the light converter and, for example, it is possible to use one that is obtained by performing silver plating on a surface of copper.

In the first to fifth embodiments, an example, in which the semiconductor light-emitting element is semiconductor laser, is described, but the semiconductor light-emitting element may be a semiconductor light-emitting element that radiates emitted light having high direction such as super luminescent diode.

In the first to fifth embodiments, an example, in which the light emitted from the illumination apparatus is the white light, is described, but the disclosure is not limited to the white light, and it may be light having a low color temperature or light having a high color temperature. The light having a low color temperature is, for example, of a color close to a lamp color called a light bulb color and yellow-white. The light having the high color temperature is, for example, of a color close to blue.

Since the illumination apparatus of the disclosure can easily change the color temperature of the emitted light, the illumination apparatus is particularly useful as a light source for projection illumination applications, a projector, a headlamp (vehicle front lamp), a light source for medical applications.

What is claimed is:

1. An illumination apparatus comprising;
   a semiconductor light-emitting element; and
   a light conversion element,
   wherein the semiconductor light-emitting element has a first optical waveguide and a second optical waveguide,
   wherein the light conversion element has a first light converter and a second light converter,
   wherein a collimator lens and a condensing lens are arranged between the semiconductor light-emitting element and the light conversion element in order in an emitting direction of the semiconductor light-emitting element,
   wherein first emitted light emitted from the first optical waveguide enters the first light converter through the collimator lens and the condensing lens,
   wherein second emitted light emitted from the second optical waveguide enters the second light converter through the collimator lens and the condensing lens, and
   wherein first power applied to the first optical waveguide and second power applied to the second optical waveguide are independent of each other.

2. The illumination apparatus of claim 1,
   wherein the first light converter lowers coherence of the first emitted light.

3. The illumination apparatus of claim 1,
   wherein the first light converter includes a transparent member having irregularities on a surface.

4. The illumination apparatus of claim 2,
   wherein a wavelength range of the second emitted light is between 430 nm and 500 nm.

5. The illumination apparatus of claim 1,
   wherein the second light converter absorbs the second emitted light and emits a second radiation light having a chromaticity point different from a chromaticity point of the second emitted light.

6. The illumination apparatus of claim 5, wherein the second light converter includes a second phosphor.

7. The illumination apparatus of claim 6, wherein the second phosphor is a yellow phosphor which converts a wavelength range of the second radiation light into a range between 550 nm and 600 nm.

8. The illumination apparatus of claim 5, wherein the first light converter absorbs the first emitted light and emits a first radiation light having a chromaticity point different from the chromaticity point of the first emitted light, and
the chromaticity point of the first radiation light differs from the chromaticity point of the second radiation light.

9. The illumination apparatus of claim 8, wherein the first light converter includes a blue phosphor, and
wherein the second light converter includes a yellow phosphor.

10. The illumination apparatus of claim 8,
wherein the semiconductor light-emitting element further has a third optical waveguide,
wherein the light conversion element further has a third light converter,
wherein a third emitted light emitted from the third optical waveguide enters the third light converter through the collimator lens and the condensing lens,
wherein the third light converter emits a third radiation light, and
wherein a chromaticity point of the third emitted light is different from a chromaticity point of the first radiation light and a chromaticity point of the second radiation light.

11. The illumination apparatus of claim 10,
wherein the first light converter includes a red phosphor,
wherein the second light converter includes a green phosphor, and
wherein the third light converter includes a blue phosphor.

* * * * *